(12) United States Patent
Brieda et al.

(10) Patent No.: US 8,665,603 B2
(45) Date of Patent: Mar. 4, 2014

(54) HOUSING FOR ELECTRICAL COMPONENTS

(75) Inventors: Alessandro Brieda, Sacile (IT);
Giovanni Scilla, Regensburg (DE);
Alessandro Scordino, Dolo (IT)

(73) Assignee: Osram Gesellschaft mit Beschraenkter Haftung, Munich (DE)

( * ) Notice: Subject to any disclaimer, the term of this patent is extended or adjusted under 35 U.S.C. 154(b) by 493 days.

(21) Appl. No.: 12/745,696

(22) PCT Filed: Dec. 3, 2007

(86) PCT No.: PCT/IT2007/000836
§ 371 (c)(1),
(2), (4) Date: Oct. 15, 2010

(87) PCT Pub. No.: WO2009/072148
PCT Pub. Date: Jun. 11, 2009

(65) Prior Publication Data
US 2011/0026231 A1   Feb. 3, 2011

(51) Int. Cl.
*H05K 5/00* (2006.01)
(52) U.S. Cl.
USPC ............................................ 361/759; 361/752
(58) Field of Classification Search
USPC ......................................................... 361/759
See application file for complete search history.

(56) References Cited

U.S. PATENT DOCUMENTS

| | | | | |
|---|---|---|---|---|
| 2,871,324 | A * | 1/1959 | Budd | 338/128 |
| 3,754,203 | A * | 8/1973 | Pauza et al. | 439/71 |
| 4,092,698 | A * | 5/1978 | Brefka | 361/752 |
| 4,346,952 | A * | 8/1982 | Bright et al. | 439/76.1 |
| 4,409,641 | A * | 10/1983 | Jakob et al. | 361/720 |
| 4,692,571 | A * | 9/1987 | Trinh et al. | 200/5 A |
| 4,912,602 | A * | 3/1990 | Zurek et al. | 361/752 |
| 5,109,981 | A * | 5/1992 | Maston et al. | 206/719 |
| 5,288,957 | A * | 2/1994 | Swaybill | 200/317 |
| 5,308,943 | A * | 5/1994 | Screven et al. | 200/521 |
| 5,349,132 | A * | 9/1994 | Miller et al. | 174/372 |
| 5,373,104 | A * | 12/1994 | Brauer | 174/562 |

(Continued)

FOREIGN PATENT DOCUMENTS

| | | |
|---|---|---|
| CN | 2332144 Y | 8/1999 |
| CN | 2735716 Y | 10/2005 |
| JP | 4355703 A | 12/1992 |
| WO | 2004010754 A1 | 1/2004 |

OTHER PUBLICATIONS

International Search Report of PCT/IT2007/000836 mailed on Aug. 21, 2008.

(Continued)

*Primary Examiner* — Jeremy Norris
*Assistant Examiner* — Nathan Milakovich

(57) ABSTRACT

A housing for electrical components is provided. The housing may include a mouth portion to cooperate with a circuit board in an assembled condition wherein said circuit board is applied against said mouth portion of the housing. The housing may include at least one spring formation located at said mouth portion to cooperate with said circuit board to elastically urge said circuit board away from said mouth portion, and at least one hook-like formation extending from said mouth portion distally of said housing, said hook-like formation adapted to cooperate with said circuit board to retain said circuit board assembled to said housing against the force exerted by said spring formation.

12 Claims, 4 Drawing Sheets

(56) References Cited

U.S. PATENT DOCUMENTS

Figure 1:
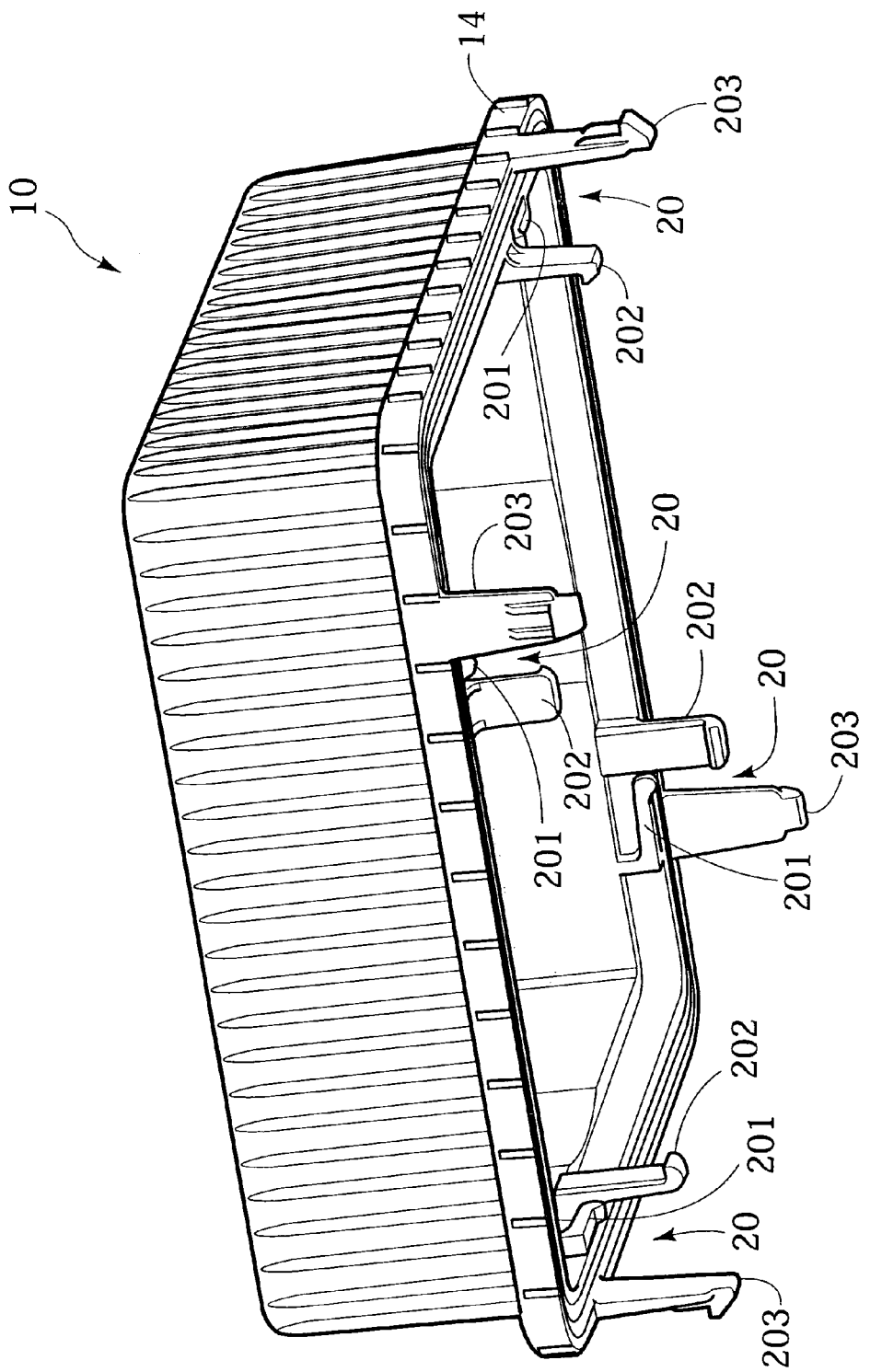

| | | | |
|---|---|---|---|
| 5,452,184 A * | 9/1995 | Scholder et al. | 361/799 |
| 5,515,240 A * | 5/1996 | Rodeffer et al. | 361/759 |
| 5,579,212 A * | 11/1996 | Albano et al. | 361/820 |
| 5,691,878 A | 11/1997 | Ahn et al. | |
| 5,911,329 A * | 6/1999 | Wark et al. | 211/41.17 |
| 5,966,010 A * | 10/1999 | Loy et al. | 324/142 |
| 6,111,760 A * | 8/2000 | Nixon | 361/814 |
| 6,297,967 B1 * | 10/2001 | Davidson et al. | 361/800 |
| 6,301,096 B1 * | 10/2001 | Wozniczka | 361/674 |
| 6,757,155 B2 * | 6/2004 | Koike et al. | 361/600 |
| 6,785,146 B2 * | 8/2004 | Koike et al. | 361/759 |
| 6,894,891 B2 * | 5/2005 | Darr et al. | 361/601 |
| 6,967,848 B2 * | 11/2005 | Klatt et al. | 361/759 |
| 7,040,905 B1 * | 5/2006 | Wang | 439/76.1 |
| 7,070,427 B2 * | 7/2006 | Liao et al. | 439/135 |
| 7,462,055 B2 * | 12/2008 | Kuo et al. | 439/330 |
| 7,619,898 B2 * | 11/2009 | Jensen | 361/736 |
| 7,813,144 B2 * | 10/2010 | Maeda | 361/809 |
| 7,911,787 B2 * | 3/2011 | Cheng | 361/690 |
| 2003/0184956 A1 * | 10/2003 | Robinson et al. | 361/659 |
| 2006/0158857 A1 * | 7/2006 | Luckner et al. | 361/719 |
| 2007/0169955 A1 * | 7/2007 | Pape et al. | 174/50 |
| 2009/0059485 A1 * | 3/2009 | Lynch et al. | 361/679.01 |
| 2009/0059502 A1 * | 3/2009 | Filson et al. | 361/681 |
| 2009/0067141 A1 * | 3/2009 | Dabov et al. | 361/753 |
| 2009/0156052 A1 * | 6/2009 | Chen | 439/500 |

OTHER PUBLICATIONS

English language abstract for JP 4355703 A, Date of Publication of JP Application 4355703 A: Sep. 12, 1992.
English abstract of CN 2735716 Y dated Oct. 19, 2005.
English abstract of CN 2332144 Y dated Aug. 4, 1999.

* cited by examiner

HOUSING FOR ELECTRICAL COMPONENTS

FIELD OF THE INVENTION

This disclosure relates to housings for electrical components, and was developed with specific attention paid to its possible use in providing housings for high-power LED lighting applications.

However, reference to this exemplary field of application is not to be construed in a limiting sense of this disclosure.

DESCRIPTION OF THE RELATED ART

Housings for electrical components may include a cup-like or tray-like body including a mouth portion intended to cooperate with a circuit board (such as e.g. a printed circuit board or PCB). In a mounted condition, the circuit board may be applied against the mouth portion of the housing so that the housing may cover and protect the electrical components mounted on the circuit board.

Housings of the type considered in the foregoing may require a large number of multi-interactive components, with complex mechanical connections and additional fixing components such as e.g. screws, gluing, and so on. These arrangements almost inevitably result in rather bulky and complex solutions, which are not desirable e.g. for LED light sources.

OBJECT AND SUMMARY OF THE INVENTION

The need is therefore felt for housing arrangements adapted for integrating a housing system structure while at the same time providing:
a stable mounting structure,
easy adjustment to tolerances in the parts being assembled,
integration between the elements assembled (also taking into account the different nature of these components e.g. electronics, optical, components producing thermal dissipation),
easy assembly/disassembly of the housing.

The object of the invention is to provide a fully satisfactory response to that need.

According to the present invention, that need is met by means of a housing for electrical components having the features set forth in the claims that follow.

The claims are an integral part of the disclosure of the invention as provided herein.

In an embodiment, such a housing includes:
at least one spring formation located at the mouth portion of the housing to cooperate with the circuit board to elastically urge the circuit board away from the mouth portion of the housing, and
at least one hook-like formation extending from the mouth portion distally of (i.e. away from) the housing; the hook-like formation is adapted to cooperate (directly or indirectly, with the possible interposition of an additional element such as e.g. a heat-sink) with the circuit board to act as a hook to retain the circuit board assembled to the housing against the force exerted by the spring formation.

In an embodiment, the hook-like formation provides a primary snap-in system providing a sandwich-like assembly while the circuit board is sandwiched between the housing and another component such as e.g. a heat-sink.

In an embodiment, the spring formation forms an integrated spring system for absorbing tolerances in the assembled part, possibly ensuring e.g. automatic optical centering of LED lighting system elements.

In an embodiment, a secondary snap-in element is included providing both a mechanical action (i.e. assembling parts) and a fluid-dynamic action (i.e. forming channels for cooling air flow).

In an embodiment, cylindrical concave elements are provided to permit easy integration with a cooling fan as well as fixing of the housing.

Embodiments of the invention provide improved performance over the prior art in terms of:
mechanical stability,
compactness,
assembly flexibility in terms of absorbing tolerances in the parts being mounted/assembled;
a multi-functional fixing structure,
a fixing arrangement which is not visible from outside,
avoiding additional fixing elements, and
a simpler manufacturing process and improved quality assurance.

BRIEF DESCRIPTION OF THE ANNEXED FIGURES

Figure 2:
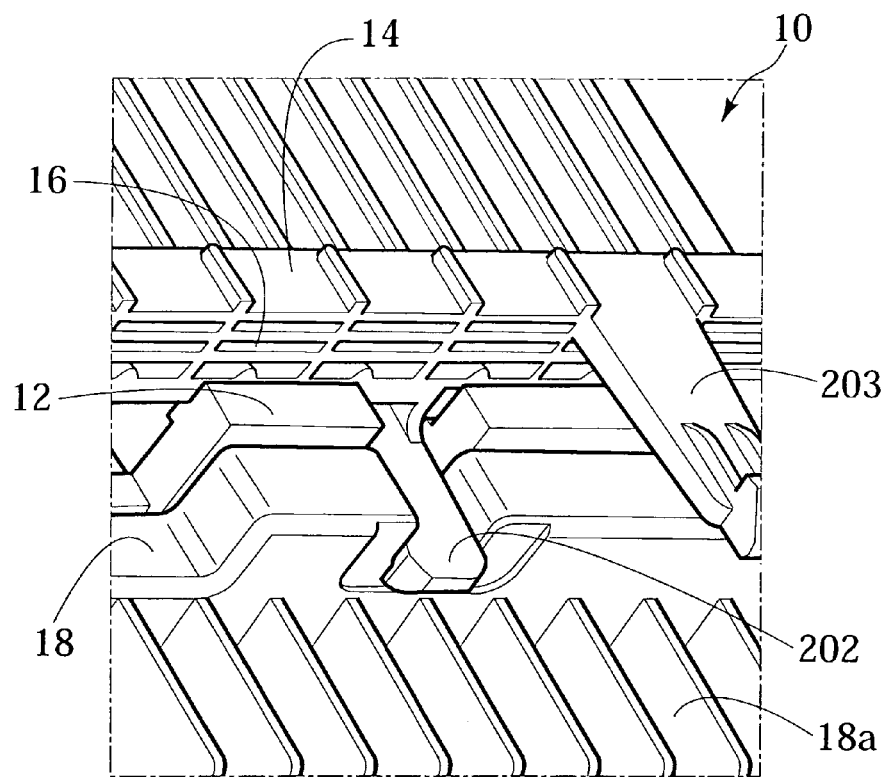
Figure 3:
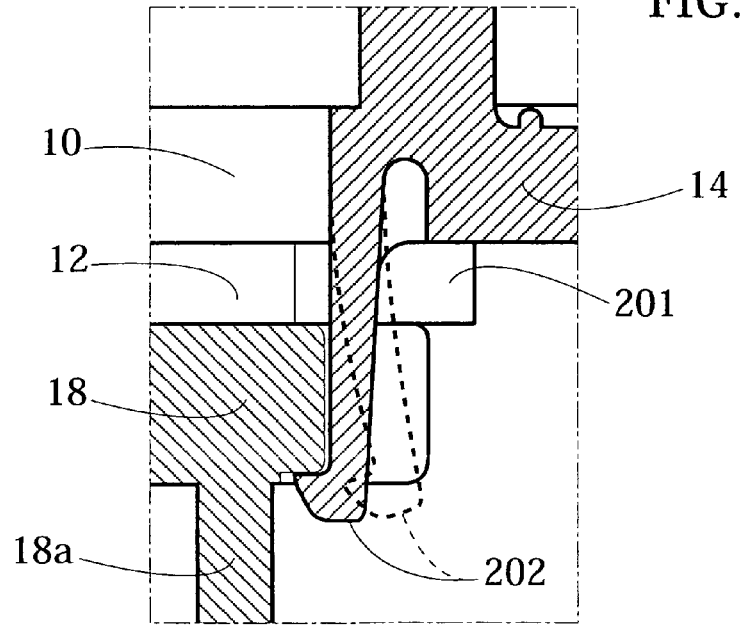
Figure 4:
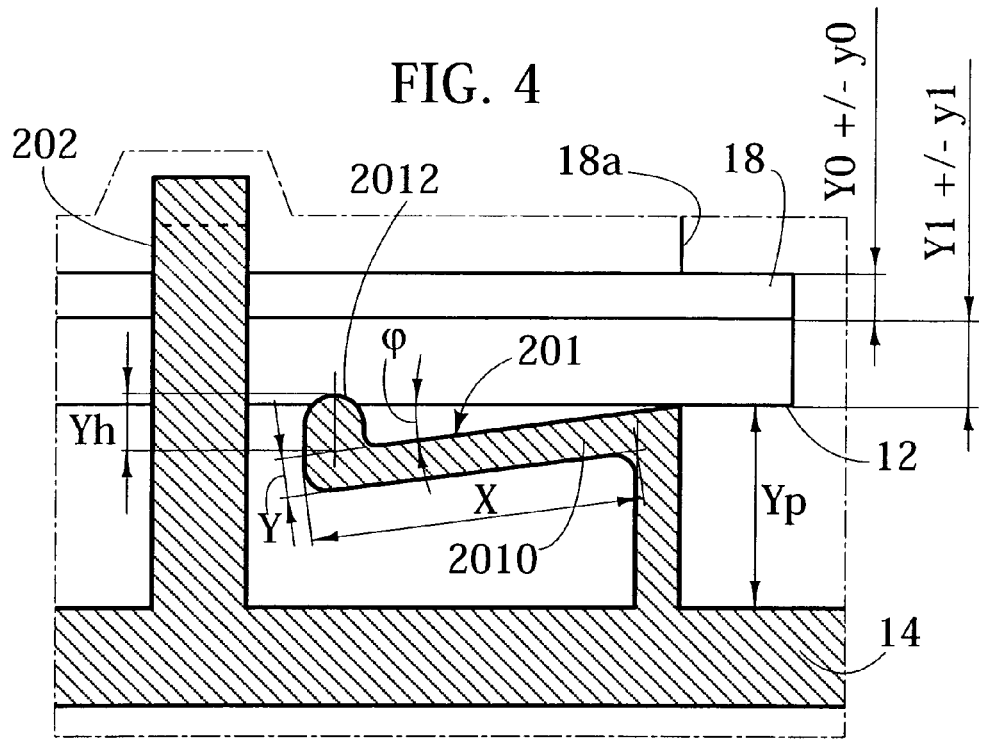
Figure 5:
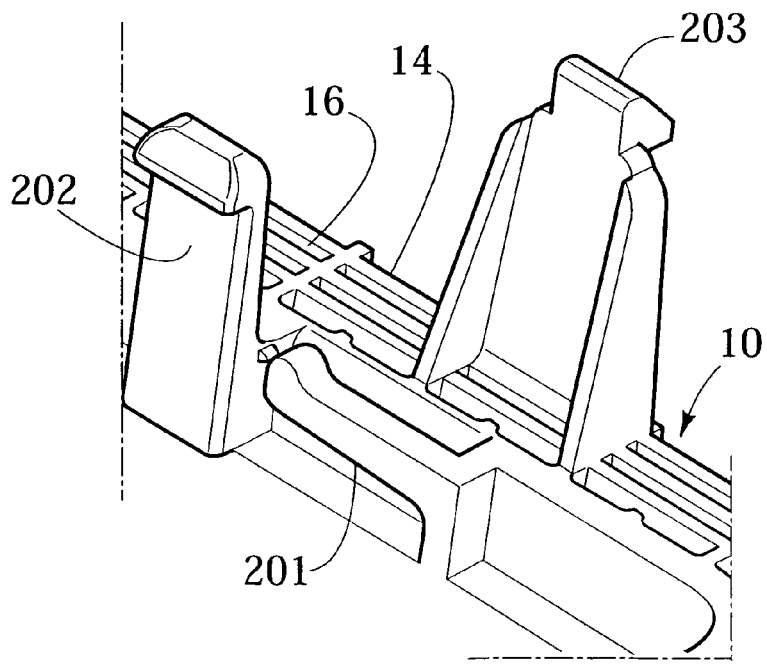

The invention will now be described, by way of example only, with reference to the annexed figures of drawing, wherein:
FIG. 1 is a general perspective view of a housing for electrical components as described herein;
FIG. 2 is representative of a condition of use of the housing of FIG. 1;
FIG. 3 is a cross-sectional view of certain elements shown in FIG. 2;
FIG. 4 is representative of the geometrical features of one of the elements shown in FIGS. 1 to 3; and
FIGS. 5 and 6 detail further features of the housing described herein.

DETAILED DESCRIPTION OF EXEMPLARY EMBODIMENTS

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment may be included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In FIG. 1, reference numeral 10 denotes as a whole a housing for electrical components.

In an embodiment, the housing 10 is comprised of a single body of a moulded material, such as plastics material.

In the exemplary embodiment shown, the housing 10 is essentially comprised of a body of an inverted-vat shape (i.e. a cup-like or tray-like shape) to define a reception volume for electrical components (e.g. electronic or photo-electronic components such as one or more LED light sources) which may be mounted—in a manner known per se—on a circuit board such as a printed circuit board or PCB 12.

For the sake of simplicity of illustration, the circuit board 12 is represented only in FIGS. 2 to 4.

In the assembled condition of the housing 10, the printed circuit board 12 is applied against the mouth portion 14 of the housing 10 in order to form a sort of a box. In an embodiment, the components mounted on the upper side of the printed circuit board 12 extend into the internal cavity of the "box" formed by the housing 10.

In the exemplary embodiment shown, the housing 10 has a parallelepiped shape overall and the mouth portion 14 is thus of a rectangular shape. Those of skill in the art will appreciate that such a general shape of the housing 10 and the mouth portion 14 thereof is in no way mandatory. Other embodiments may include e.g. a housing 10 which has e.g. a cylindrical, hemispherical, ovoidal shape (this list being in no way exhaustive) and the mouth portion 14 may present a shape which is e.g. round, polygonal, lobe-shaped (this list being again in no way exhaustive).

Figure 6:
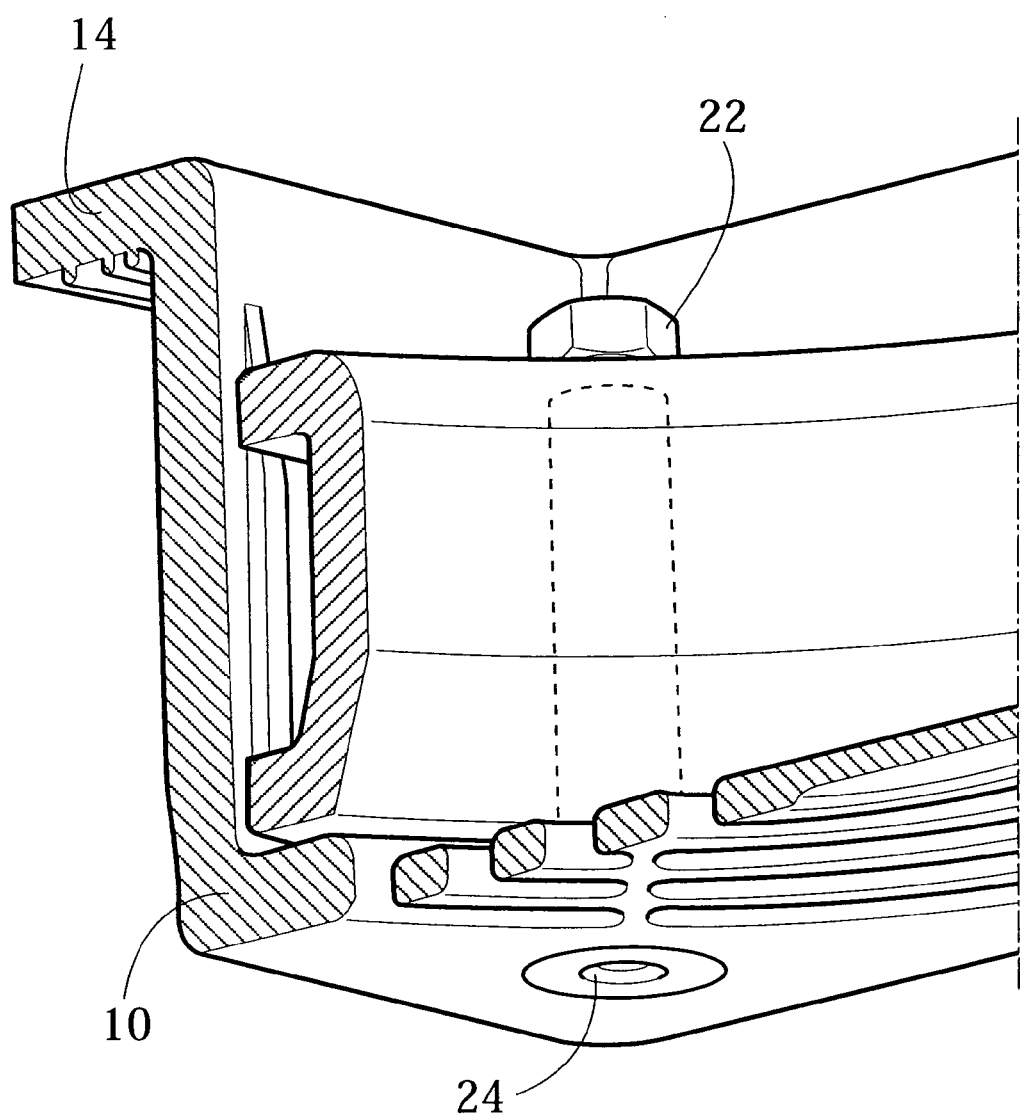

The housing 10 may be closed at its bottom or apertured e.g. include only a peripheral wall and/or be only partly closed at the bottom portion of the cup-shape: in FIG. 6 an embodiment is shown where the bottom wall of the housing 10 is provided with apertures in the form of arched slits to provide passageways for cooling air as propelled by a cooling fan.

In the exemplary embodiment shown, the mouth portion 14 is defined by a flange at least partly outwardly protruding from the peripheral wall of the housing 10. Such a flange 14 may be provided with openings 16 (visible both in FIG. 2 and in FIG. 5) that bestow on the flange 10 a sort of grill-like appearance.

In the embodiment to which FIGS. 2 and 3 refer, the printed circuit board 12 is a flat board applied against the mouth portion 14 of the housing 10 as the intermediate element of a sandwich-like arrangement also including a further component such as a heat-sink providing thermal dissipation for the components mounted on the printed circuit board 12.

Such an additional component as the heat-sink 18 may include:
 a flat web portion adapted to lie against the face of the circuit board 12, and
 fins or other protrusions 18a extending from the web portion away from the housing 10 (i.e. distally of the housing 10 in the final assembled position).

As better appreciated in FIGS. 2 and 3, the sandwich-like arrangement referred to in the foregoing will thus include the housing 10 and the heat-sink 18 having the printed circuit board 12 sandwiched therebetween at the mouth portion 14 of the housing 10.

Distributed along the periphery of the mouth portion 14 are a plurality of locking assemblies 20.

In the exemplary embodiment shown herein, four locking assemblies 20 are arranged at each of the four sides of the mouth portion 14 of the housing 10.

In the exemplary embodiment shown, each locking assembly 20 is located at least slightly off-centre the respective side of the mouth portion 14, the various locking assemblies 20 being otherwise almost uniformly distributed over the whole development of the mouth portion 14.

While a plurality of such locking assemblies 20 are shown, those of skill in the art will appreciate that the presence of a plurality of such assemblies is not mandatory, since just one locking assembly 20 may well serve the purposes herein.

The or each assembly 20 is comprised of at least two elements that ensure proper assembly of the printed circuit board 12 (and possibly the heat-sink 18) against the mouth portion 14 of the housing 10. A third element may be optionally present as better detailed in the following.

The first element in the locking assembly 20 is a tongue-like spring element 201 having the overall shape shown in greater detail in FIG. 4. In an embodiment, the spring or springs 201 is/are integrally moulded with the housing 10.

Specifically, FIG. 4 shows the geometrical characteristics of an exemplary spring element 201 extending cantilever-like from the mouth portion 14 of the housing 10. These geometric features will be detailed in the following.

Essentially, the role of the (each) spring 201 may be to cooperate with the periphery of the printed circuit board 12 in order to elastically urge the circuit board 12 away from the mouth portion 14 of the housing 10. Stated otherwise, as the board 12 (possibly associated with the heat-sink 18) is placed against the mouth portion 14 of the housing 10, the spring or springs 201 will elastically deform under the pressure exerted by the board 12 and thus exert a contrary reaction force which will tend to "push" the board 12 (and the heat-sink 18) away from the mouth portion 14 of the housing 10.

The complete displacement of the board 12 (and the heat-sink 18) away from the mouth portion 14 of the housing 10, with the ensuing risk of separation from the housing 10, is prevented by the hook-like action exerted by the second element 202 included in the (or each) locking assembly 20.

In an embodiment, the hook-like element or elements 202 is/are integrally moulded with the housing 10.

As indicated, the spring or springs 201 will tend to push the board 12 and the heat-sink 18 away from the housing 10. The hook-like formation or formations 202 has/have a distal hook portion projecting at least slightly radially inwardly of the housing and thus adapted to snap-in engage with the board 12 and/or the flat web portion of the heat-sink 18 as better shown in FIG. 3 in order to prevent ("lock") the movement of the board 12 and the heat-sink 10 away from the housing 10.

In an embodiment, co-operation of the hook-like formation or formations 202 with the periphery of the board 12 and the flat web portion of the heat-sink 18 is a "snap-in" cooperation due to an elastically resilient nature of the hook-like formations 202.

During an exemplary assembly step with the housing 10, the board 12 (having the components mounted thereon) and the heat-sink 18 are advanced towards the mouth portion 14 of the housing 10. Due to the flexible nature of the element or elements 202, the hook (i.e. "head") portions of the element(s) 202, which at least slightly protrude radially inwardly of the housing 10, will slightly spread open as schematically shown in FIG. 3 and thus permit the board 12 to be brought into abutment against the mouth portion 14 of the housing 10.

The length of the elements 202 may be defined as a function of the thickness of the board 12 and of the web portion of the heat-sink 18 in such a way to permit the hook portion of the or each element 202 to snap-in engage "behind" the web portion of the heat-sink 18 as shown in full line in FIG. 13 so that the board 12 and the heat-sink 18 will be anchored against the mouth portion 14 of the housing 10.

In those embodiments where the presence of the heat-sink 18 (or any other similar component to be associated with the board 12) is not envisaged, the length of the elements 202 may be defined as a function of the thickness of the board 12 (alone) in such a way to permit the hook portion of the or each element 202 to snap-in engage "behind" the board 12 so that the board 12 will be anchored against the mouth portion 14 of the housing 10.

Similarly, while abutment against the mouth portion 14 of the housing 10 has been referred to in the foregoing for the sake of simplicity, observation of FIG. 4 shows that the board 12 will not exactly abut against the mouth portion 14 of the housing 10 but rather against the spring or springs 201 extending therefrom.

The elastic coupling thus achieved will absorb any tolerances (including the board 12 being possibly slightly warped) while providing a strong anchoring force (e.g. 2N minimum) largely sufficient to bestow the required stability on the sandwich structure comprised of the housing 10 and the heat-sink 18 having the board 12 sandwiched therebetween.

As better detailed in FIG. 4, in an embodiment, the spring 201 is in the form of a L-shaped cantilever spring element including a proximal portion extending from the mouth portion 14 approximately orthogonal thereto and a distal portion or "arm" 2010 extending approximately parallel (in fact, at an angle $\phi$) to the mouth portion 14 of the housing 10 and terminating with an outwardly protruding spherical or cylindrical head 2012 adapted to cooperate with the board 12.

In FIG. 4, X denotes the length of the arm 2010 while $\phi$ denotes the deformation angle formed by the arm 2010 with respect to the direction of the plane of the mouth portion 14 of the housing 10.

$Y_h$ denotes the interference between the compressed components (that is the board 12 and the web portion of the heat-sink 18 which are compressed between the head 2012 of the spring 201 and the distal hook portion of the element 202) in terms of punctual pressure.

$Y_h$ can be generally written as:

$$Y_h = f(X, \phi, \sigma \text{ material})$$

where:
X=arm of the spring 201
$\phi$=angle of deformation
$\sigma$=elastic deformation of the material comprising the spring.

According to the geometrical relationship $Y_h = X \cdot \sin(\phi)$, the spring arm (X) can be regulated by adjusting $Y_h$ and $\phi$. For instance the following relationship can be defined:

$$\begin{cases} X = n \times Y_h \\ \phi = (1°, \ldots, 45°) \end{cases}$$

where typically n=(1, ..., 6).

The value of $Y_h$ is also correlated with the tolerance analysis of the compressed components, as follows:

$$\begin{cases} Y_h \geq Th_{min} < + \sum_{i=0}^{n} Y_{i,min} \\ Y_h \leq \frac{1}{k} \sum_{i=0}^{n} (Y_i + y_i) \end{cases}$$

where:
$Y_i$ is the thickness of the i-th component,
$y_i$ is the tolerance of the i-th component
$Th_{min}$ is the minimum thickness related to the mechanical material characteristic; a typical value for $Th_{min}$ may be between 100-3000 micron.
K is an a-dimensional factor related to the maximum admissible elastic elongation as follows:

$$K \propto \frac{1}{\varepsilon_x} \propto \frac{1}{\sigma_{elastic}}$$

where
$\varepsilon_x$=x direction elongation.

For instance, by referring to FIG. 4, the following spring parameters can be selected:

$$\begin{cases} Y_h = 0.2 + y_{0min} = 0.45 \text{ mm} \\ Y_h \leq \frac{1}{3} \sum_{i=0}^{1} (Y_i + y_i) = 1.08 \text{ mm} \end{cases}$$

A value of $Y_h$ of 0.5 millimeters may thus be selected.

In the drawings, reference numeral 203 denotes a further element which may be included in the or each locking assembly 20.

The element 203 is another hook-like formation having a hook-like configuration complementary to the hook-like configuration of the element 202. Stated otherwise, while the distal hook portion of the element 202 protrudes radially inwardly of the housing 10 to snap-in engage the board 12 (and the heat-sink 18, if present), the element 203 has a distal hook portion extending radially outwardly of the housing 10. In an embodiment, the element 203 is integrally moulded with the housing 10.

The element 203 may form an additional snap-in system to provide a clamp position for external components of the assembly such as additional housing part that includes and/or covers all above mentioned fixing structures.

In the embodiment shown, the further hook-like element 203 is arranged at the outer rim of the flange 14 comprising the mouth portion of the housing 10 so as to extend in correspondence with the openings/apertures 16 intended to form an airflow passages to facilitate cooling of the arrangement.

The "body" or "root" portion of the element 203 preferably exhibits a channel-like shape so that the proximal portion thereof located at the flange 14 is not obstructive of air flow through the apertures or openings 16.

FIG. 6 is exemplary of the possibility of providing at one or more of the corners of the housing 10 thickened portions 22 having an axial through hole 24 extending therethrough. These holes 24 permit mounting fixing element such as screws to fix a fan to the housing 10 to complete assembly thereof.

Without prejudice to the underlying principle of the invention, the details and embodiments may vary, even significantly with respect to what has been described herein without departing from the scope of the invention as defined by the annexed claims.

The invention claimed is:
1. A housing for electrical components, the housing comprising:
   a mouth portion to cooperate with a circuit board in an assembled condition wherein said circuit board is applied against said mouth portion of the housing, the housing comprising:
   at least one spring formation located at said mouth portion to cooperate with said circuit board to elastically urge said circuit board away from said mouth portion, and
   at least one hook-like formation extending from said mouth portion distally of said housing, said hook-like formation adapted to cooperate with said circuit board to retain said circuit board assembled to said housing against the force exerted by said spring formation.
2. The housing of claim 1, further comprising:
   a plurality of locking assemblies, each assembly comprising one said spring formation and one said hook-like formation, said locking assemblies distributed over the periphery of said mouth portion.

3. The housing of claim 1,
wherein said at least one spring formation and said at least one hook-like formation are integrally formed with said housing.

4. The housing of claim 1,
wherein said at least one spring formation is in the form of a flexible cantilever beam.

5. The housing of claim 1,
wherein said at least one spring formation is an L-shaped formation.

6. The housing of claim 1,
wherein said at least one spring formation comprises a distal head to cooperate with said circuit board.

7. The housing of claim 1,
for assembly with the circuit board having a given thickness, said circuit board coupled with a further element having a web portion having a respective thickness, wherein said at least one hook-like formation has a length corresponding to the combined thickness of said circuit board and said web portion of said further element.

8. The housing of claim 1,
wherein said at least one hook-like formation includes a distal hook portion projecting radially inwardly of the housing.

9. The housing of claim 1, further comprising:
at least one further hook-like formation located at said mouth portion and having a distal hook formation projecting radially outwardly of said housing.

10. The housing of claim 9, further comprising:
a flange defining said mouth portion of the housing, said flange provided with openings bestowing on said flange a grid-like structure forming passageways for cooling air and wherein said further hook-like formation has a channel-like structure defining a flow path for said cooling air.

11. The housing of claim 9,
wherein said further hook-like formation is integrally formed with said housing.

12. The housing of claim 1,
wherein said housing includes thickened portions having openings for fixing screws extending therethrough.

\* \* \* \* \*